United States Patent
Zhou et al.

(10) Patent No.: US 8,271,860 B2
(45) Date of Patent: Sep. 18, 2012

(54) RETRANSMISSION METHOD AND DEVICE BASED ON LOW DENSITY PARITY CHECK CODES

(75) Inventors: Mingchun Zhou, Shenzhen (CN); Yuejun Wei, Shenzhen (CN)

(73) Assignee: Huawei Technologies Co. Ltd., Shenzhen (CN)

( * ) Notice: Subject to any disclaimer, the term of this patent is extended or adjusted under 35 U.S.C. 154(b) by 318 days.

(21) Appl. No.: 12/691,091

(22) Filed: Jan. 21, 2010

(65) Prior Publication Data

US 2010/0131818 A1    May 27, 2010

Related U.S. Application Data

(63) Continuation of application No. PCT/CN2008/070622, filed on Mar. 28, 2008.

(30) Foreign Application Priority Data

Aug. 28, 2007    (CN) .......................... 2007 1 0076819

(51) Int. Cl.
    *H03M 13/00*    (2006.01)
(52) U.S. Cl. .......................... 714/790; 714/758; 714/801
(58) Field of Classification Search .................. 714/790, 714/758, 774, 852, 752, 801, 755
    See application file for complete search history.

(56) References Cited

U.S. PATENT DOCUMENTS

| | | | |
|---|---|---|---|
| 7,254,769 B2 * | 8/2007 | Kim et al. ..................... | 714/774 |
| 7,600,173 B2 * | 10/2009 | Matsumoto ................... | 714/755 |
| 7,940,687 B2 * | 5/2011 | Sampath ........................ | 370/252 |
| 7,954,041 B2 * | 5/2011 | Hong et al. ................... | 714/790 |
| 8,027,402 B2 * | 9/2011 | Lee et al. ....................... | 375/267 |
| 2005/0249300 A1 | 11/2005 | Jeong et al. | |
| 2006/0156181 A1 | 7/2006 | Ha et al. | |
| 2007/0011567 A1 | 1/2007 | Choi et al. | |

FOREIGN PATENT DOCUMENTS

| | | |
|---|---|---|
| CN | 1798012 A | 7/2006 |
| CN | 1951115 A | 4/2007 |

(Continued)

OTHER PUBLICATIONS

English Translation of the Written Opinion of the International Searching Authority, PCT/CN2008/070622, dated Jul. 10, 2008, 3 pages.

(Continued)

*Primary Examiner* — Fritz Alphonse
(74) *Attorney, Agent, or Firm* — Slater & Matsil, L.L.P.

(57) ABSTRACT

A retransmission method based on Low Density Parity Check (LDPC) and devices thereof are provided in embodiment of this present invention, so as to increase the system throughput. In the present invention, when retransmission is needed, the partial bits in the information sequence to be retransmitted are replaced by the prior information that the transmitter and the receiver both have know, with the replaced information sequence is LDPC coded, LDPC check sequence is obtained and is sent to the receiver. After receiving the LDPC check sequence, the receiver decodes the information sequence including the prior information with the LDPC check sequence. If the decoding is successful, after removing the prior information from the decoded information sequence, the receiver refills the decoded bits in a previous received information sequence, and performs decoding again with an LDPC check sequence corresponding to the previous received information sequence and obtains a complete information sequence.

20 Claims, 7 Drawing Sheets

FOREIGN PATENT DOCUMENTS

JP          2002064470 A      2/2002

OTHER PUBLICATIONS

Extended European Search Report, Application No./Patent No. 08715358.1-2415/2161869, Applicant Huawei Technologies Co., Ltd., dated Oct. 25, 2010, 11 pages.

Dammer, U., et al., "A Data Puncturing IR-Scheme for Type-II Hybrid ARQ Protocols using LDPC Codes," IEEE Communications Society, Globecom 2004, pp. 3012-3016, 2004, IEEE.

Zesong, F., et al., "Type II Hybrid-ARQ Schemes of LDPC Codes Based on Information-Nulling Rate-Compatible Algorithm," 2006 6$^{th}$ International Conference on ITS Telecommunications Proceedings, pp. 569-572, 2006, IEEE.

* cited by examiner

RETRANSMISSION METHOD AND DEVICE BASED ON LOW DENSITY PARITY CHECK CODES

CROSS-REFERENCE TO RELATED APPLICATIONS

This application is a continuation of International Application No. PCT/CN2008/070622, filed on Mar. 28, 2008, which claims priority to Chinese Patent Application No. 200710076819.6, filed on Aug. 28, 2007, both of which are hereby incorporated by reference in their entireties.

FIELD OF THE INVENTION

The present invention relates to communications, and in particular, to channel encoding/decoding and transmission technologies.

BACKGROUND OF THE INVENTION

Channel encoding/decoding is a relatively independent technology in a mobile communication system and is a key technology that decides performance of the mobile communication system. The purpose of channel encoding/decoding is to reduce the signal transmission power and overcome signal fading that is unavoidable in a radio transmission environment.

The combination of channel encoding/decoding and interleaving reduces the bit error rate. In comparison with non-encoding scenarios, the bit error rate of traditional convolutional codes can be reduced by two orders of magnitude to $1E^{-3}$-$1E^{-4}$ and the bit error rate of Turbo (a computer software language) codes can be reduced to $1E^{-6}$. The Low Density Parity Check (LDPC) code is a new attraction in the channel encoding/decoding field and is widely used besides Turbo codes.

An important performance of channel encoding/decoding is the error correction capability (or protection capability) which is reflected by the number of packets that can be corrected within a total number of packets if a maximum of allowed lost packets is specified, or reflected by the percentage of packets that can be corrected when the number of lost packets exceeds the maximum of allowed lost packets. Generally, when other conditions are the same, the stronger the error correction capability of channel encoding/decoding is, the higher the redundancy rate of data codes will be.

To meet the requirements of higher data transmission speeds and more powerful error correction capabilities, High Speed Downlink Packet Access (HSDPA) which combines Adaptive Modulation and Coding (AMC), Hybrid Automatic Retransmission Request (HARQ), and fast NodeB scheduling, is adopted in the 3rd Generation (3G) Wideband Code Division Multiple Access (WCDMA) system to achieve high-speed downlink data transmission.

LDPC-based HARQ includes two categories: Chase and Incremental Redundancy (IR). Chase means that the previous transmitted packet is retransmitted in its entirety and that the receiver combines and decodes the early and later received information. IR means that redundancy bit information is added in retransmission and that the receiver combines and decodes the early and later received data blocks.

During the implementation of the present invention, the inventor, however, finds the prior art subject to at least the following problem: In order to support for IR, both coder and decoder are required to be of multi-rate capabilities, and result in more complex than Chase. However, if Chase is adopted, it will cause a low system throughput.

SUMMARY OF THE INVENTION

Embodiments of the present invention intend to provide a retransmission method and devices thereof based on LDPC codes so as to increase the system throughput.

One aspect of the present invention provides a retransmission method based on LDPC codes, including:

generating, by a transmitter, an information sequence by substituting prior information for partial bits in an information sequence to be retransmitted, the prior information being recognizable to both the transmitter and a receiver;

generating, by the transmitter, an LDPC check sequence by encoding the generated information sequence with LDPC codes; and transmitting, by the transmitter, the LDPC check sequence to the receiver.

Another aspect of the present invention provides a retransmission receiving method based on LDPC codes, including:

receiving, by a receiver, an LDPC check sequence from a transmitter;

decoding, by the receiver, an information sequence including prior information according to the LDPC check sequence, the prior information being recognizable to both the transmitter and the receiver;

if the decoding is successful, obtaining, by the receiver, a complete information sequence by decoding a refilled information sequence with an LDPC check sequence corresponding to a previous received information sequence, the refilled information sequence is generated by refilling the decoded information sequence without the prior information in the previous received information sequence.

Another aspect of the present invention provides a transmitter, including:

a substituting unit, configured to substitute prior information for partial bits of an information sequence to be retransmitted, wherein the prior information being recognizable to both the transmitter and a receiver;

an encoding unit, configured to encode the information sequence obtained by the substituting unit with LDPC codes and obtain an LDPC check sequence; and a sending unit, configured to send the LDPC check sequence outputted from the encoding unit to the receiver.

Another aspect of the present invention provides a receiver, including:

a receiving unit, configured to receive an LDPC check sequence from a transmitter;

a first decoding unit, configured to decode an information sequence including prior information according to the LDPC check sequence, wherein the prior information being recognizable both to the receiver and the transmitter;

a refilling unit, configured to remove the prior information from decoded information sequence if the first decoding unit decodes successfully, and refill the decoded information without the prior information in a previous received information sequence;

a second decoding unit, configured to decode the refilled information sequence with an LDPC check sequence corresponding to the previous received information sequence, and obtain a complete information sequence.

Compared with the prior art, exemplary embodiments of the present invention provides the following feature and benefit:

When retransmission is necessary, prior information recognizable to both the transmitter and the receiver is used to replace some bits in the information sequence to be retransmitted and the information sequence obtained after the replacement is encoded with LDPC codes, an LDPC check sequence is obtained and sent to the receiver. After receiving the LDPC check sequence, the receiver decodes the information sequence including the prior information with the LDPC check sequence. Because unknown bits corresponding to the check sequence are fewer, the check performance is better and the probability of correct decoding by the receiver is increased. If the decoding is successful, after removing the prior information from the successfully decoded information sequence, the receiver refills the decoded bits in the previous received information sequence, and decodes the information sequence again with the LDPC check sequence corresponding to the information sequence and obtains the complete information sequence. Because unknown bits to be checked with the LDPC check sequence are fewer, the check performance is better and the probability of correct decoding by the receiver is increased so that the system throughput is increased.

DETAILED DESCRIPTION OF THE EMBODIMENTS

To better explain the objective, technical solution and advantages of the embodiments of present invention, the following describes embodiments of the present invention in detail with reference to the accompanying drawings.

A first embodiment of the present invention relates to a retransmission method base on LDPC codes. In this embodiment, the transmitter substitutes prior information for partial bits in the information sequence to be retransmitted, and encodes the replaced information sequence with LDPC codes, an LDPC check sequence is obtained and is sent to the receiver. The prior information is recognizable to both the transmitter and the receiver. The receiver uses the received LDPC check sequence to decode the information sequence including the prior information. If the decoding is successful, the receiver removes the prior information from the decoded information sequence, refills the decoded information sequence without the prior information in a previous received information sequence, and decodes the refilled information sequence with an LDPC check sequence corresponding to the previous received information sequence and obtains a complete information sequence. Due to unknown bits corresponding to the check sequence in retransmission are fewer, the check performance is better and the probability of correct decoding by the receiver is increased so that the system throughput is increased.

Figure 1:
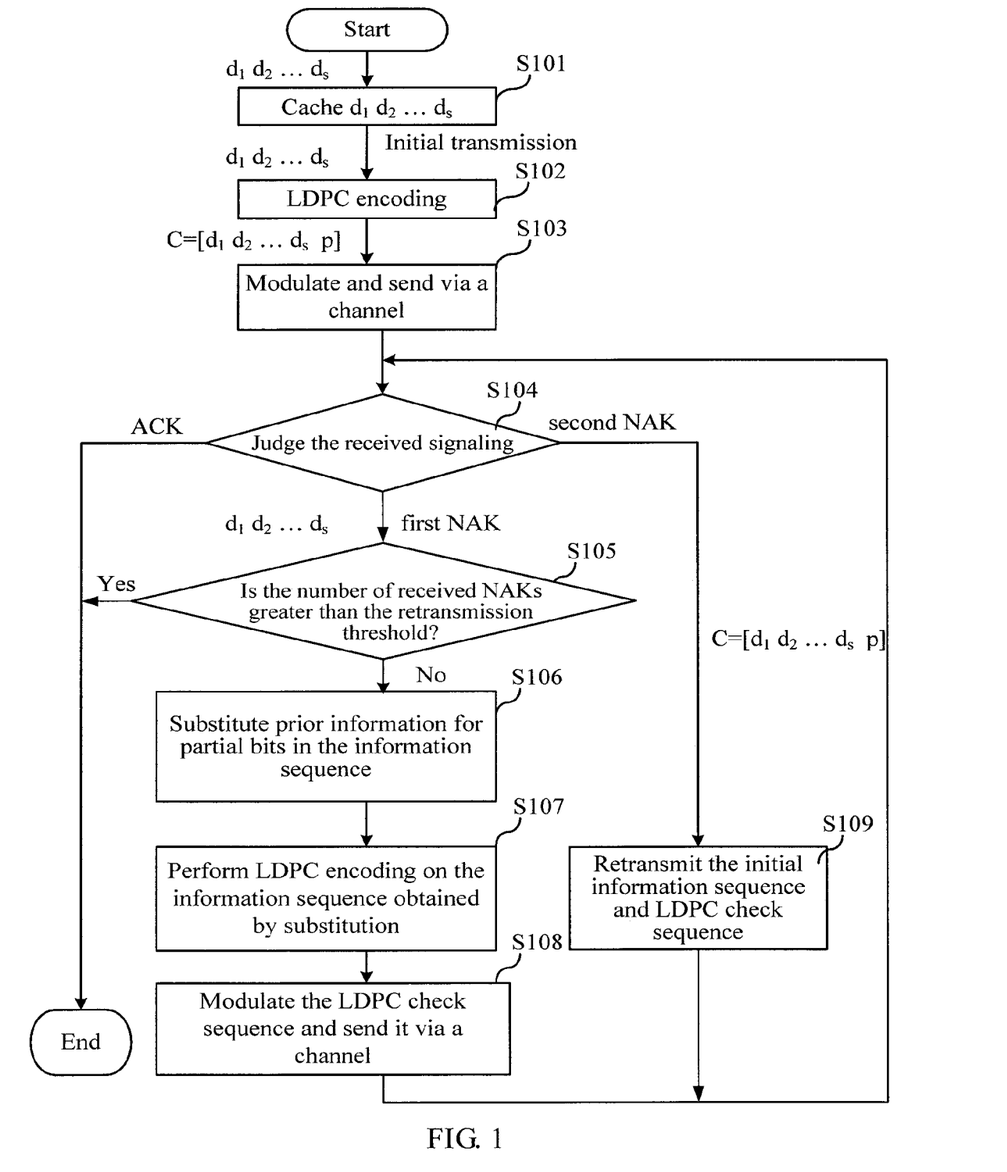
FIG. 1 shows a flowchart of an LDPC based retransmission method according to a first embodiment of the present invention.

Referring to FIG. 1, in block S101, the transmitter caches the information sequence d1 d2 . . . ds to be transmitted to get ready for transmission.

In block S102, the initially transmitted information sequence d1 d2 . . . ds is encoded by using LDPC codes, an encoded code sequence C=[d1 d2 . . . ds p], wherein the p represents the LDPC check sequence.

In block S103, the code sequence C=[d1 d2 . . . ds p] is modulated and transmitted to the receiver via a channel.

Upon reception of the initially transmitted information sequence d1 d2 . . . ds and the check sequence p, if the receiver decodes the code sequence successfully, the receiver sends an Acknowledgement (ACK) to the transmitter; if the decoding fails, the receiver sends a first Negative Acknowledgment (NAK) to the transmitter.

In block S104, the transmitter receives the response message from the receiver after the initial transmission and judges the received message. Specifically, if the transmitter receives an ACK from the receiver, the procedure ends; if the transmitter receives a first NAK from the receiver, the process proceeds to block S105; if the transmitter receives a second NAK from the receiver, the process proceeds to block S109. The second NAK will be explained in a subsequent procedure.

In addition, in block S104, the transmitter may receive responses other than the ACK, first NAK and second NAK or may receive no response when the waiting time expires. In such cases, appropriate processing may be performed according to the existing system setting. For example, if no response is received, the transmitter determines that the system communication fails. Such cases are not much relevant to the content of an exemplary embodiment of the present invention and will not be detailed herein.

In block S105, the transmitter judges whether the number of received first NAK is greater than a retransmission threshold N. If the number is smaller than or equal to N, the process proceeds to block S106; if the number is greater than N, the transmitter performs appropriate processing according to the system setting. For example, the transmitter may discard the information d1 d2 . . . ds, and continue to get, cache and process subsequent information.

Figure 2:
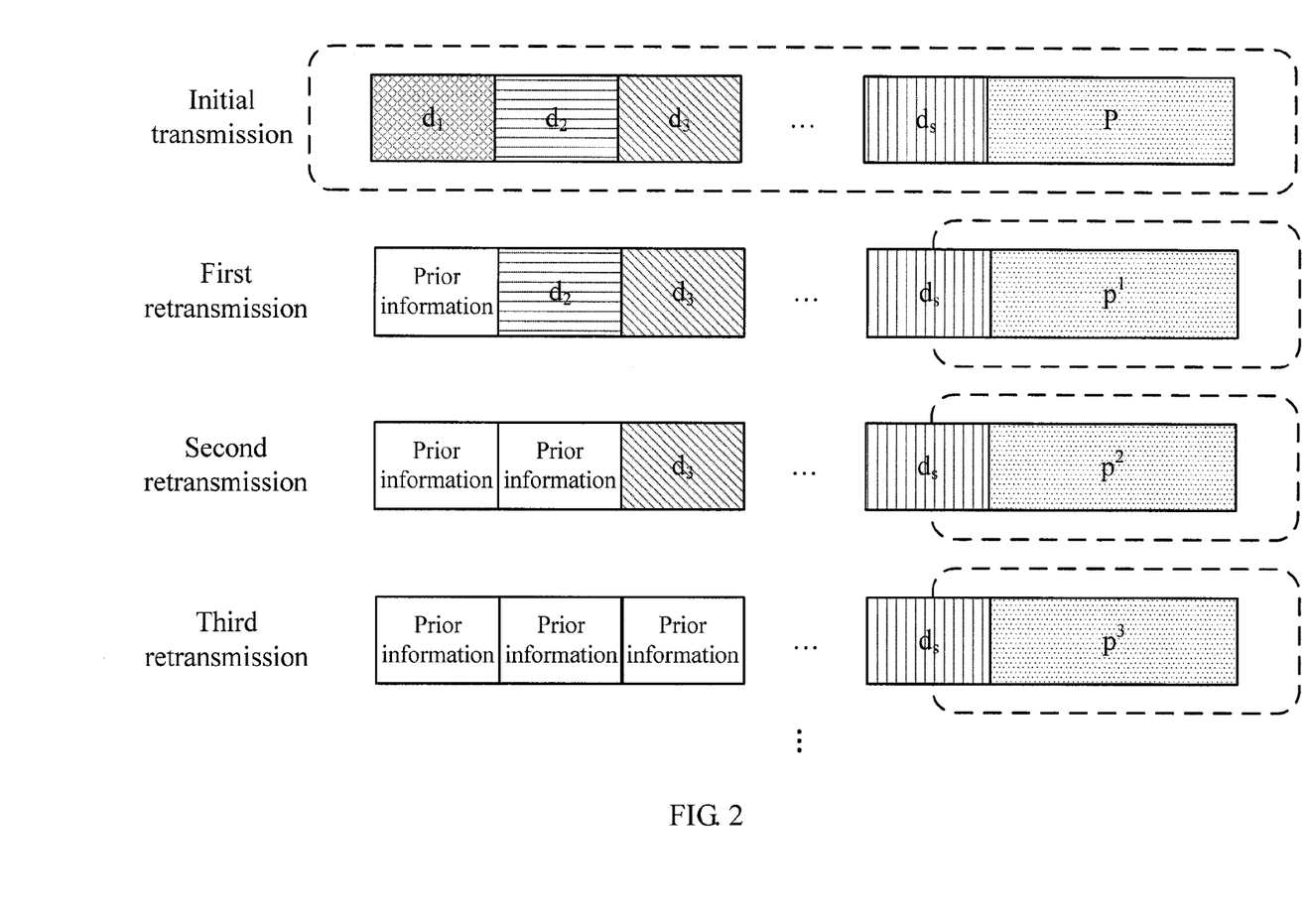
FIG. 2 is a schematic drawing showing substitution of prior information under different numbers of retransmissions in the LDPC based retransmission method according to the first embodiment of the present invention.
Figure 3:
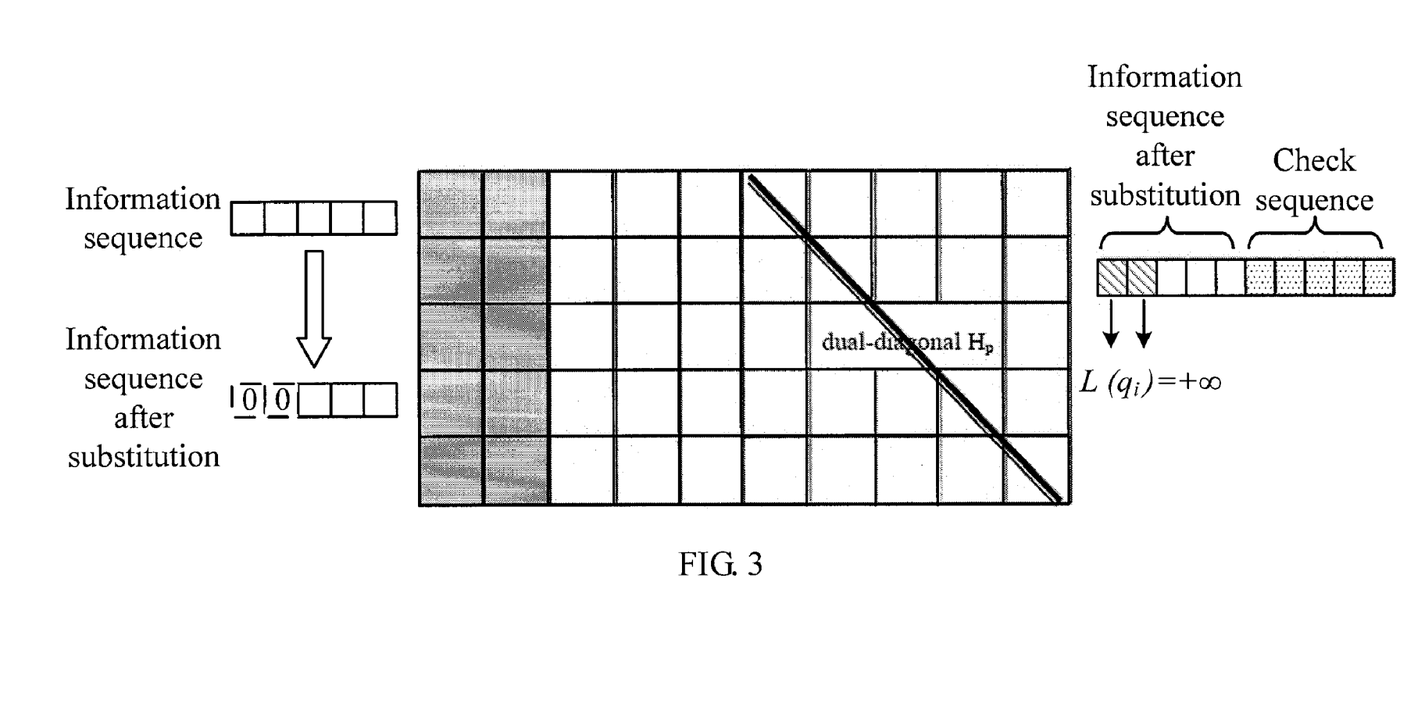
FIG. 3 is a schematic drawing showing substitution of prior information in an information sequence in the LDPC based retransmission method according to the first embodiment of the present invention.

In block S106, the transmitter substitutes prior information for partial bits in the information sequence to be retransmitted. The prior information is recognizable to both the transmitter and the receiver. Simple prior information may be all 0s or other known binary numbers such as 101010 . . . . The number of bits replaced by the prior information may be determined according to the number of received first NAK or the number of retransmissions. The greater the number of received first NAK is or the greater the number of retransmissions is, the more bits will be replaced, as shown in FIG. 2. For example, when the first first NAK is received, i.e. during the first retransmission, 12.5% of the bits in the information sequence to be retransmitted are replaced; when the second first NAK is received, i.e. during the second retransmission, 25% of the bits are replaced; when the third first NAK is received, i.e. during the third retransmission, 37.5% of the bits are replaced; or with respect to the information sequence d1 d2 . . . ds, during the first retransmission, the transmitter substitutes prior information for d1. Supposing the prior information is all 0s, the information sequence obtained after substitution is 0 d2 . . . ds. During the second retransmission, the transmitter substitutes prior information for d1 d2 to get the information sequence 0 0 d3 . . . ds and so on. Such processing is shown in FIG. 3. It should be noted that the three retransmissions shown in FIG. 2 is just an exemplary case which does not mean the maximum retransmission threshold is 3. The maximum retransmission threshold may be other values, such as 1.

After block S106, the process proceeds to block S107.

In block S107, the information sequence obtained after substitution of prior information is encoded by using LDPC codes, the corresponding check sequence is obtained. For example, the first retransmitted information 0 d2 . . . ds is encoded by using LDPC codes, the check sequence p1 is obtained, and the second retransmitted information 0 0 . . . ds is encoded by using LDPC codes, the check sequence p2 is obtained, and so on. Because the substitution of prior information happens before encoding, the equivalent code rate with retransmission is reduced without changing the encoding/decoding matrix. Moreover, the encoding/decoding matrix used may be an optimal encoding/decoding matrix so as to further improve the system throughput.

Then, the process proceeds to block S108, the obtained LDPC check sequence is modulated, and the modulated LDPC check sequence is sent to the receiver via a channel. Afterwards, the procedure goes back to block S104 to monitor response messages from the receiver.

After the receiver receives the LDPC check sequence from the transmitter, the receiver uses the LDPC check sequence to decode the information sequence including the same prior information. If the decoding fails, the receiver sends another first NAK; if the decoding is successful, the receiver removes the prior information from the decoded information sequence, the receiver refills the decoded information sequence without the prior information in the initially received information sequenced d1' d2' . . . ds'. Then the receiver uses the initially received LDPC check sequence to re-decode the refilled information sequence. If the re-decoding is successful, a complete information sequence is obtained. If the re-decoding fails again, the receiver returns a second NAK.

In block S104, if the transmitter receives the second NAK from the receiver, the process proceeds to block S109. The second NAK from the receiver indicates that the receiver successfully decodes the information sequence including the prior information by using the retransmitted LDPC check sequence, but fails to decode the information sequence d1' d2' . . . ds' replaced with the successfully decoded bits. Therefore, in block S109, the transmitter retransmits the initially transmitted information sequence and the corresponding LDPC check sequence, i.e. C[d1 d2 . . . ds p]. Afterwards, the procedure returns to block S104.

It should be noted that, in the above procedure, only the LDPC check sequence is retransmitted to the receiver. In practice, however, the transmitter may send the information sequence substituted by the prior information and the corresponding check sequence together to the receiver.

A second embodiment of the present invention also relates to a retransmission method based on LDPC codes, which is similar to the first embodiment. The difference is: in the first embodiment, after the transmitter first retransmits the LDPC check sequence, if the transmitter receives a first NAK from the receiver, the first NAK indicates that the receiver fails to decode the information sequence including the prior information by using the retransmitted LDPC check sequence, then the transmitter substitutes prior information for more bits in the information sequence, encodes the replaced bits by using LDPC codes and sends the new LDPC check sequence to the receiver; in the second embodiment, after the transmitter first retransmits the LDPC check sequence, if the transmitter receives the first NAK from the receiver, the transmitter retransmits the LDPC check sequence, and if another first NAK is received, the transmitter substitutes prior information for more bits in the information sequence and afterwards performs the same processing as in the first embodiment.

For example, the initially transmitted information is C=[d1 d2 . . . ds p], wherein d1 d2 . . . ds is an information sequence and the p represents the initially retransmitted LDPC check sequence. At the first retransmission, the transmitter substitutes prior information for d1. Supposing the prior information is all 0s, the information sequence obtained after substitution is 0 d2 . . . ds. After the information sequence is encoded with LDPC codes, the obtained LDPC check sequence is p1. After the transmitter sends p1 to the receiver, if the transmitter receives a first NAK from the receiver, the transmitter retransmits p1. If afterwards, the transmitter still receives a first NAK from the receiver, the transmitter substitutes the prior information for d1 d2 to get the information sequence 0 0 . . . ds. Then the transmitter encodes 0 0 . . . ds with LDPC codes, obtains an LDPC check sequence p2, and sends the p2 to the receiver.

A third embodiment, which is similar to the first embodiment, of the present invention also relates to a retransmission method based on LDPC codes. The difference lies in that: in the first embodiment, when the transmitter receives a second NAK from the receiver, the second NAK indicates the receiver decodes successfully the information sequence including the prior information with the retransmitted LDPC check sequence, but still fails to decode the information sequence d1 d2 . . . ds refilled with the successfully decoded bits, the transmitter retransmits the initially transmitted information sequence and the corresponding check sequence to the receiver; in the third embodiment, when the transmitter receives a second NAK from the receiver, the transmitter retransmits only the unsuccessfully decoded bits to the receiver. This means the transmitter substitutes prior information for the bits, which are successfully decoded by the receiver in the information sequence, and encodes the replaced information sequence with LDPC codes, and obtains an LDPC check sequence. Then the transmitter sends the LDPC check sequence and the replaced information sequence to the receiver.

For example, the initially transmitted information is C=[d1 d2 . . . ds p], where d1 d2 . . . ds is an information sequence and p represents the initially transmitted LDPC check sequence; at the third retransmission, the transmitter substitutes prior information for d1 d2 d3. Supposing the prior information is all 0s, the information sequence obtained after the substitution is 0 0 0 d4 . . . ds. The transmitter encodes the replaced information sequence with LDPC codes, and obtains an LDPC check sequence p3. After the transmitter sends p3 to the receiver, the transmitter receives a second NAK from the receiver, the second NAK means the receiver decodes 0 0 0 d4 . . . ds successfully according to p3, but after the receiver refills the decoded d4 . . . ds in the previous received d1 d2 . . . ds, the receiver fails to decode the refilled information sequence with p. In this case, the transmitter may substitute the prior information for the bits d4 . . . ds that are successfully decoded and retain the unsuccessfully decoded bits, and obtains d1 d2 d3 . . . 0 . Then the transmitter encodes the replaced information sequence with LDPC codes, obtains an LDPC check sequence, and sends the d1 d2 d3 . . . 0 and the obtained LDPC check sequence together to the receiver for decoding.

A fourth embodiment of the present invention provides a retransmission receiving method based on LDPC codes.

After the receiver receives the initially transmitted information sequence and check sequence, if the information sequence cannot be successfully decoded according to the check sequence, the receiver sends a first NAK to the transmitter and waits for the LDPC check sequence retransmitted by the transmitter. Then the receiver uses the newly received LDPC check sequence to decode the information sequence that including the prior information. If the decoding is successful, the receiver removes the prior information from the decoded information sequence, the receiver refills the decoded information sequence without the prior information in the initially received information sequence, and decodes the refilled information sequence with the LDPC check sequence corresponding to the previous received information sequence and obtains the complete information sequence.

Figure 4:
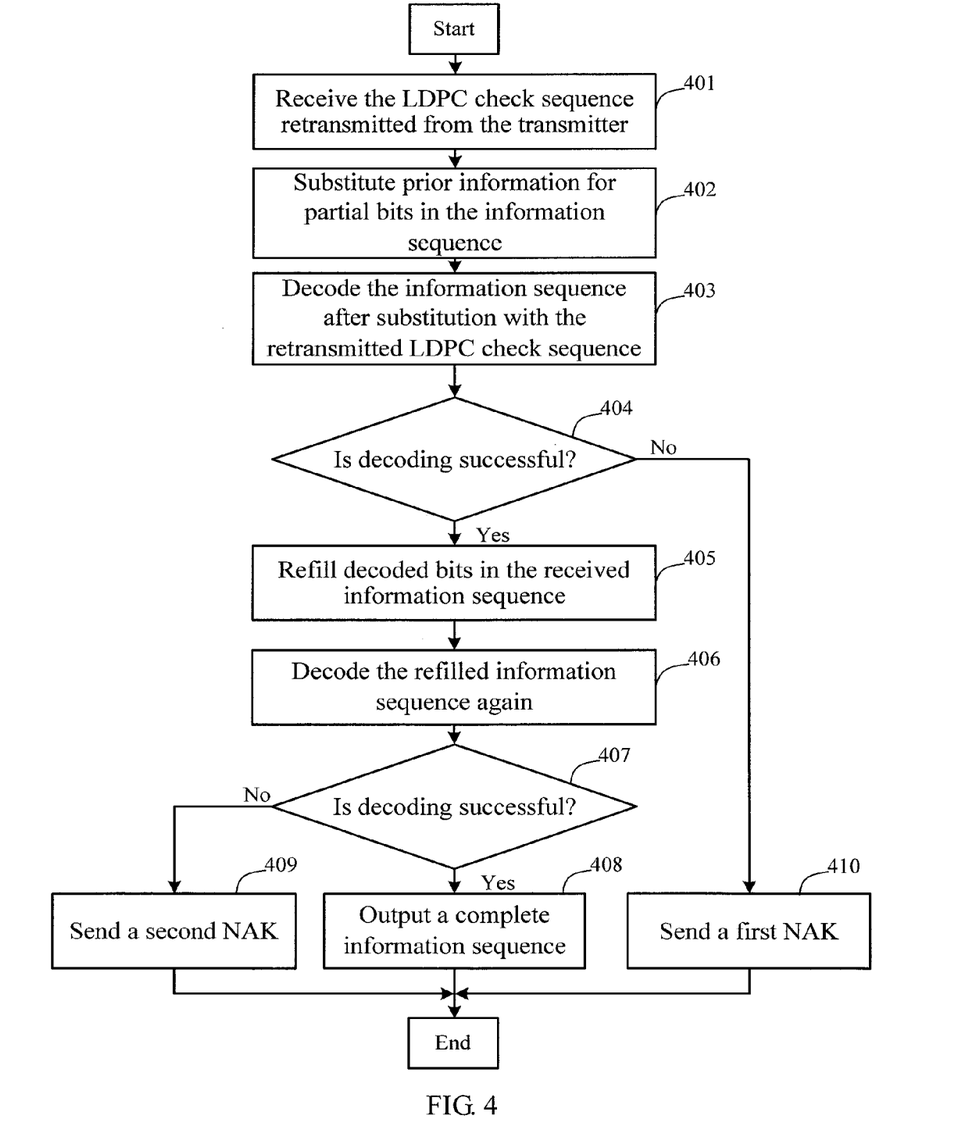
FIG. 4 shows a flowchart of an LDPC based retransmission receiving method according to a fourth embodiment of the present invention.

Referring to FIG. 4. Suppose the initial information received by the receiver is C=[d1' d2' . . . ds' p], wherein d1' d2' . . . ds' is the received information sequence and the p is the check sequence of the information sequence. In block S401, the receiver receives an LDPC check sequence from the transmitter.

In block S402, the receiver substitutes the same prior information as that of the transmitter for the same part of the initially received information sequence. For example, suppose the prior information is all 0s. At the first retransmission, the receiver substitutes the prior information for d1' and obtains the replaced information sequence 0 d2' . . . ds'. At the second retransmission, the receiver substitutes the prior information for d1' and d2' and obtains the information sequence 0 0 d3' . . . ds' and so on. The substitution mode of the transmitter and the receiver and the values of the prior information for substitution are predetermined by both parties.

Because the initially received information sequence is mapped likelihood ratio information, when partial bits in the information sequence are replaced with the prior information, it is also necessary to map the prior information and substitute the likelihood ratio information of the mapped prior information for the bits in the information sequence. The prior information is usually binary numbers, whose initial probability information is described in equation (1). The mapped prior information should be an infinity, where 0 is a negative infinity and 1 is a positive infinity. In emulation, a great enough value can be used to replace the infinity.

$$L(q_{ij}) = L(c_j) \triangleq \log \frac{p_r(x_j = +1 \mid y_j)}{p_r(x_j = -1 \mid y_j)} = \log \frac{\left(1 + e^{-2y_j/\sigma^2}\right)^{-1}}{\left(1 + e^{+2y_j/\sigma^2}\right)^{-1}} = 2y_j/\sigma^2 \quad (1)$$

In block S403, the receiver decodes the information sequence including the prior information with the current received retransmitted LDPC check sequence. Taking the first retransmission as an example, the receiver decodes 0 d2' . . . ds' including the prior information with the check sequence p1.

In block S404, the receiver judges the decoding result. If the decoding is successful, the bits that are not replaced by the prior information are confirmed. Taking the first retransmission as an example, this indicates the confirmed d2 . . . ds is obtained and the process proceeds to block S405. If the decoding fails, the process proceeds to block S410 to send a first NAK to the transmitter, indicating that the information sequence including the prior information is decoded unsuccessfully according to the LDPC check sequence.

In block S405, the receiver removes the prior information from the decoded information sequence, refills the decoded information sequence without the prior information in the previous received information sequence, i.e. the receiver fills the confirmed bits in the previous received information sequence. As in the above example, the receiver removes the prior information 0 from the decoded information sequence 0 d2 . . . ds, the receiver fills d2 . . . ds in the initially transmitted information sequence d1' d2' . . . ds'.

Figure 5:
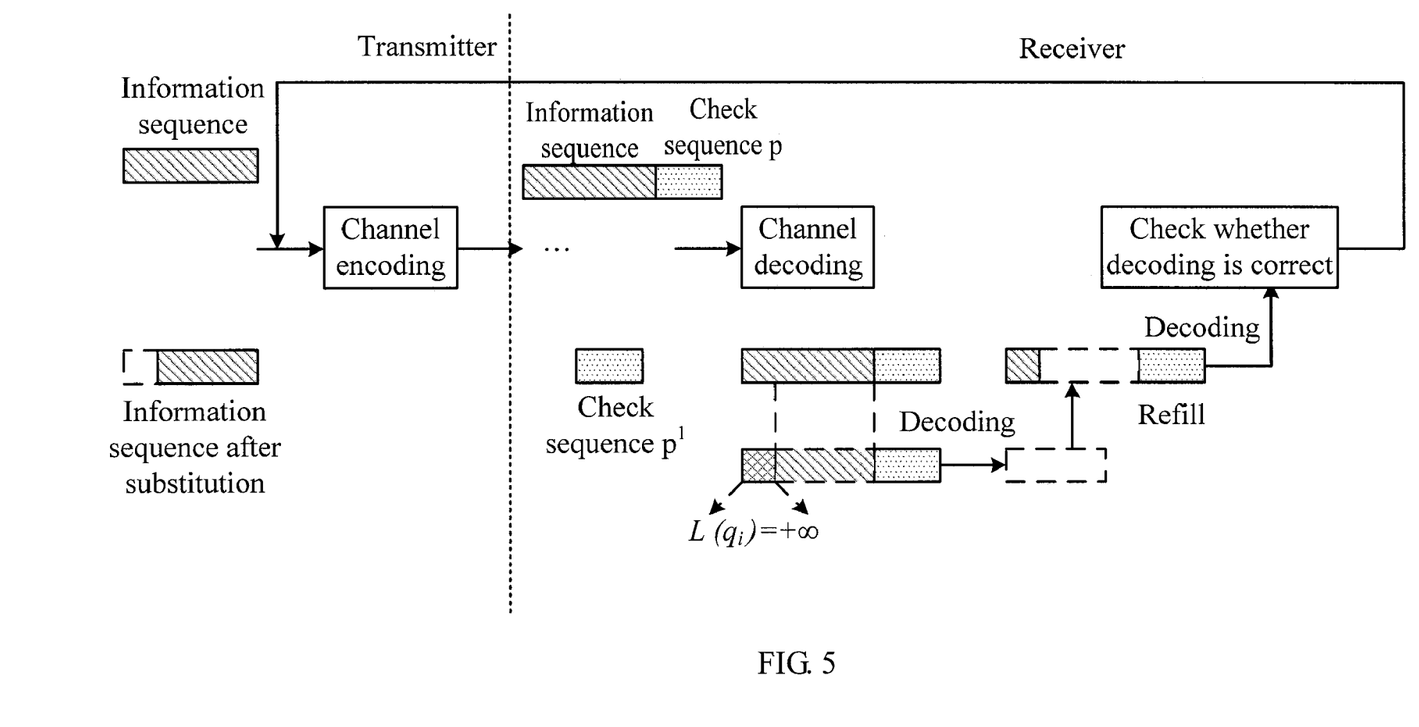
FIG. 5 is a schematic drawing showing the refilling of bits in the LDPC based retransmission receiving method according to the fourth embodiment of the present invention.

Before the refilling, it is also necessary to map the information sequence with prior information removed and obtain the corresponding likelihood ratio information as shown in equation (2) and fill the likelihood ratio information in the previous received information sequence, as shown in FIG. 5.

$$\begin{cases} d_i = 0 & LLR_i = \text{Max} \\ d_i = 1 & LLR_i = -\text{Max} \end{cases} (i = 2, 3 \ldots , s) \quad (2)$$

In block S406, the receiver decodes the refilled information sequence again with the LDPC check sequence corresponding to the previous received information sequence. Specifically, the receiver decodes the refilled information sequence d1' d2 . . . ds with the initially received check sequence. Because d2 . . . ds are confirmed bits, the check ability to d1' is improved so that the probability of decoding accuracy is increased.

In block S407, the receiver determines whether the second decoding is successful, the process proceeds to block S408 if the second decoding is successful, outputting the complete information sequence and sending an ACK to the transmitter. If the decoding fails again, block S409 follows, sending a second NAK to the transmitter, indicating the receiver successfully decodes the information sequence including the prior information by using the retransmitted LDPC check sequence, but fails to decode the information sequence refilled with the successfully decoded.

In block S409, after the receiver sends the second NAK to the transmitter, the receiver receives again from the transmitter the information sequence and the corresponding check sequence as in the initial transmission.

In block S410, after the receiver sends a first NAK to the transmitter, the receiver receives again from the transmitter a new LDPC check sequence, and decodes the information sequence including the prior information by using the new check sequence, wherein the number of bits of the prior information included in the information sequence is greater than the number of bits of the prior information included in the last decoded information sequence. This means the transmitter removes more bits of the information sequence, replaces the removed bits with the prior information, and generates a new LDPC check sequence according to the replaced information sequence. The procedure is the same as the procedure shown in FIG. 4.

It should be noted that, after the receiver successfully decodes the information sequence by using the newly retransmitted LDPC check sequence, the receiver may directly fill the successfully decoded bits in the initial information sequence to decode the filled information sequence again, as shown in FIG. 4. Alternatively, the receiver may fill the successfully decoded bits in the last retransmitted information sequence including the prior information, decode the filled information sequence again with the last retransmitted LDPC check sequence and obtains more confirmed information. Afterwards, the receiver refills the confirmed information in the initial information sequence and decodes the refilled information sequence again.

For example, at the first retransmission, the transmitter substitutes the prior information 0 for d1, encodes the replaced information sequence 0 d2 . . . ds with LDPC codes and sends the check sequence p1 to the receiver; at the second retransmission, the transmitter substitutes the prior information 0 for d1 d2, encodes the replaced information sequence 0 0 d3 . . . ds with LDPC codes and sends the check sequence p2 to the receiver. The receiver first decodes the information sequence 0 0 d3' . . . ds' according to p2. If the decoding is successful, the receiver obtains the confirmed d3 . . . ds, fills d3 . . . ds in 0 d2' . . . ds', and decodes the information sequence again according to the earlier received p1 to get the confirmed d2. Then, the receiver fills d2 . . . ds in the information sequence d1' d2' . . . ds' and decodes the information sequence according to the initially received p, and obtains the complete information sequence finally.

In addition, in block S401, the receiver may simultaneously receive a retransmitted LDPC check sequence and the corresponding information sequence that including the prior information from the transmitter. In this case, the receiver may not execute block S402 but execute block S403 directly.

A fifth embodiment, which is similar to the fourth embodiment, of the present invention also provides a retransmission receiving method based on LDPC codes. The difference lies in that: in the fourth embodiment, after the receiver sends a first NAK to the transmitter, the receiver receives a new LDPC check sequence, which is generated by the transmitter according to an information sequence obtained by the transmitter by removing more bits from the information sequence and replacing the removed bits with the prior information; in the fifth embodiment, after the receiver sends a first NAK to the transmitter, the receiver receives the last retransmitted LDPC check sequence again and decodes the information sequence again according to the check sequence and if the decoding fails again, the transmitter sends a new LDPC check sequence to the receiver and the later steps are the same as those in the fourth embodiment.

A sixth embodiment, which is similar to the fourth embodiment, of the present invention also provides a transmission receiving method based on LDPC codes. The difference lies in that: in the fourth embodiment, after the receiver sends a second NAK, the receiver receives the information sequence and the LDPC check sequence corresponding to the information sequence from the transmitter again, and decodes the newly received information sequence according to the new LDPC check sequence; in the sixth embodiment, after the receiver sends a second NAK, the receiver receives an information sequence including the prior information (the information sequence corresponds to the unsuccessfully decoded part) from the transmitter and the LDPC check sequence corresponding to the information sequence, and decodes the newly received information sequence according to the newly received LDPC check sequence to get the unsuccessfully decoded bits.

For example, the information initially received by the receiver is C=[d1' d2' . . . ds' p], where d1' d2' . . . ds' is an information sequence and the p represents the initially transmitted LDPC check sequence; at the third retransmission, the transmitter substitutes prior information for d1 d2 d3. Supposing the prior information is all 0s, the information sequence obtained after the substitution is 0 0 0 d4 . . . ds. The transmitter encodes the replaced information sequence with LDPC codes and obtains the LDPC check sequence p3. After the transmitter sends p3 to the receiver, the transmitter receives a second NAK from the receiver, which means the receiver decodes 0 0 0 d4' . . . ds' successfully according to p3, but after the receiver refills the decoded d4 . . . ds in the previous received d1' d2' . . . ds', the receiver fails to decode the information sequence with p. In this case, the transmitter may substitute the prior information for the bits d4 . . . ds that are successfully decoded and retain the unsuccessfully decoded bits, and obtain d1 d2 d3 . . . 0. Then the transmitter encodes the replaced information sequence with LDPC codes and obtains an LDPC check sequence, sends d1 d2 d3 . . . 0 and the obtained LDPC check sequence together to the receiver. The receiver decodes d1' d2' d3' . . . 0 according to the received check sequence and obtains d1 d2 d3, combines the bits with the previous successfully decoded d4 . . . ds and obtains the complete information sequence.

Figure 6:
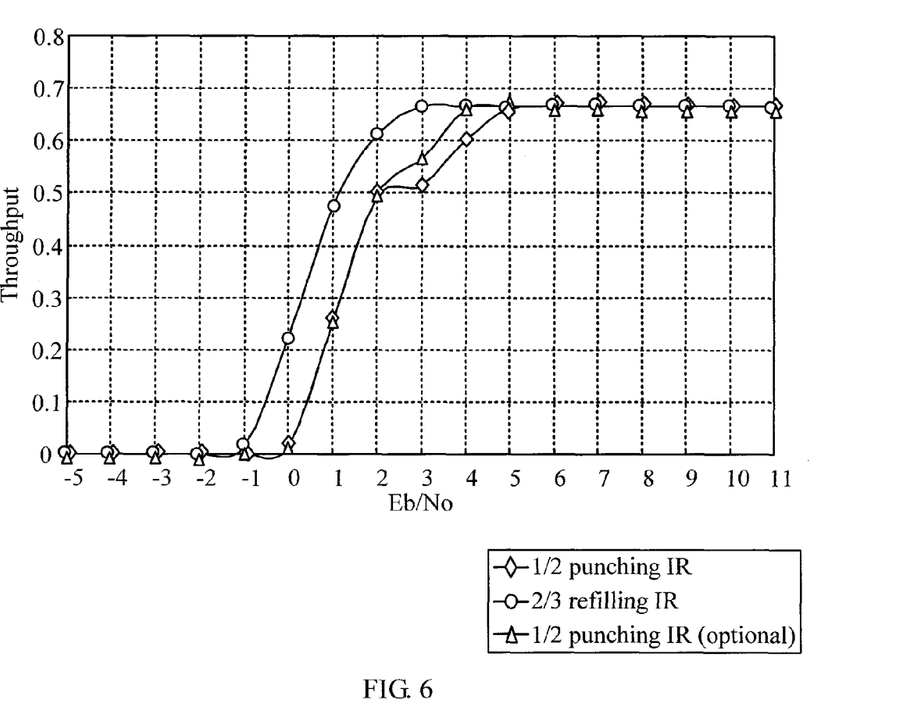
FIG. 6 is a schematic drawing comparing by emulation the system throughput in the LDPC based retransmission receiving method according to the fourth embodiment of the present invention.

FIG. 6 illustrates the comparison by emulation the system throughputs when different retransmission and retransmission receiving methods are in use. In FIG. 6, the abscissa represents the signal-to-interference ratio (Eb/No) of the system and the ordinate represents the system throughput. The curve separated by circles is the throughput obtained after the application of the method in the embodiment of the present invention, where the information transmitted is (432, 288) parent code words (code sequence) at a ⅔ rate and the maximum number of retransmissions is 1. The curve separated by triangles represents the throughput obtained after the application of the retransmission method with cross punching of check bits, where the information transmitted is (576, 288) parent code words (code sequence) at a ½ rate. The curve separated by diamonds represents the throughput obtained with the simplest method where check bits are divided into two blocks and the second block is removed in the initial transmission and the first block is removed in a retransmission, and the information transmitted is (576, 288) parent code words (code sequence) at a ½ rate. As shown in FIG. 6, under a same signal-to-interference ratio, the use of the retransmission and retransmission receiving method provided in the embodiment of the present invention will get the largest system throughput.

Figure 7:
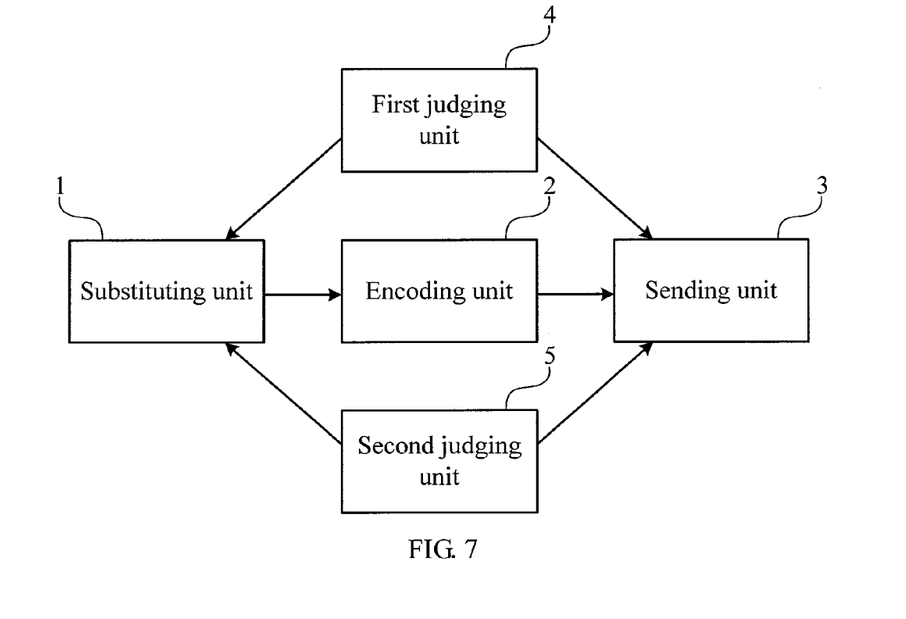
FIG. 7 is a schematic drawing illustrating the structure of a transmitter according to a seventh embodiment of the present invention.

A seventh embodiment of the present invention provides a transmitter. As shown in FIG. 7, the transmitter includes:

a substituting unit 1, configured to substitute prior information for partial bits of an information sequence to be retransmitted, where the prior information is recognizable to both the transmitter and a receiver;

an encoding unit 2, configured to encode the information sequence obtained by the substituting unit 1 with LDPC codes and obtain an LDPC check sequence; and a sending unit 3, configured to send the LDPC check sequence outputted from the encoding unit 2 to the receiver.

Because unknown bits corresponding to the check sequence are fewer, the check performance is better and the probability of correct decoding by the receiver is increased so that the system throughput is increased.

In addition, because the substitution of prior information happens before encoding, the equivalent code rate with retransmission is reduced without changing the encoding/decoding matrix. Moreover, the coding/decoding matrix used may be an optimal encoding/decoding matrix so as to further improve the system throughput.

The transmitter may further include a first judging unit 4, which is configured to determine whether a first signaling from the receiver is received, where the first signaling indicates that the receiver fails to decode the information sequence including the prior information according to the LDPC check sequence. When determining that a first signaling is received, the first judging unit 4 instructs the sending unit 3 to retransmit the LDPC check sequence. Or when determining that a first signaling is received, the first judging unit 4 instructs the substituting unit 1 to continue substituting the prior information for partial bits in the information sequence to be retransmitted, where the number of replaced bits is greater than the number of previous replaced bits; the encoding unit 2 encodes the information sequence obtained by the substituting unit 1 with the LDPC codes and obtains a new LDPC check sequence; and the sending unit 3 sends the new LDPC check sequence outputted from the encoding unit 2 to the receiver.

The transmitter may further include a second judging unit 5, which is configured to judge whether a second signaling from the receiver is received, where the second signaling indicates that the receiver successfully decodes the information sequence including the prior information according to the LDPC check sequence but fails to decode the initially received information sequence refilled with successfully decoded bits. When determining that a second signaling is received, the second judging unit 5 instructs the sending unit 3 to send the information sequence to be retransmitted and the LDPC check sequence obtained by LDPC encoding of the information sequence to be retransmitted to the receiver. Or when determining that a second signaling is received, the second judging unit 5 instructs the substituting unit 1 to substitute the prior information for the successfully decoded bits in the information sequence; the encoding unit 2 encodes the information sequence obtained by the substituting unit 1 with LDPC codes and obtains an LDPC check sequence; and the sending unit 3 transmits the LDPC check sequence outputted by the encoding unit 2 and the information sequence obtained by the substituting unit 1 to the receiver.

Figure 8:
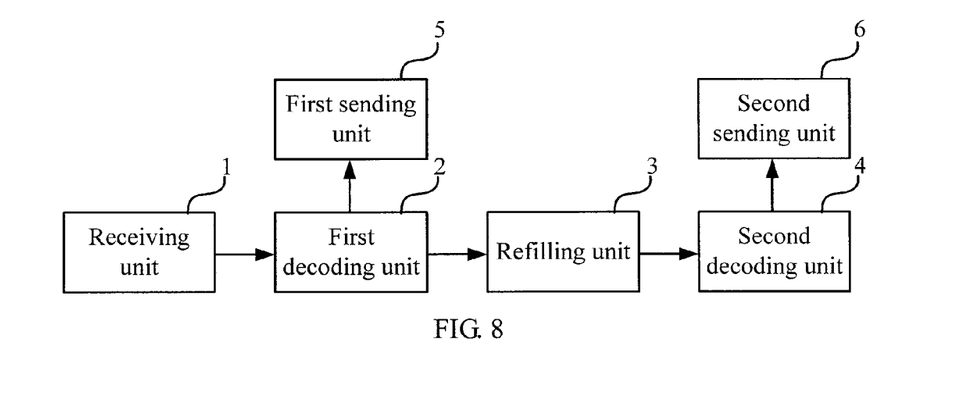
FIG. 8 is a schematic drawing illustrating the structure of a receiver according to an eighth embodiment of the present invention.

An eighth embodiment of the present invention provides a receiver. As shown in FIG. 8, the receiver includes:

a receiving unit 1, configured to receive an LDPC check sequence from a transmitter;

a first decoding unit 2, configured to decode an information sequence including prior information according to the current received LDPC check sequence, where the prior information is recognizable to both the transmitter and the receiver;

a refilling unit 3, configured to refill the decoded bits in the previous received information sequence (including the information sequence received at the initial transmission or the information sequence received in an earlier retransmission) after removing the prior information from the information sequence successfully decoded by the first decoding unit 2; and a second decoding unit 4, configured to decode the refilled information sequence with the LDPC check sequence corresponding to the information sequence and obtain a complete information sequence.

The receiver may further include a first sending unit 5, which is configured to send a first signaling to the transmitter when decoding of the first decoding unit 2 fails, where the first signaling indicates that the decoding of the information sequence including the prior information according to the LDPC check sequence fails; the receiving unit 1 is further configured to receive the LDPC check sequence again from the transmitter after the first sending unit 5 sends the first signaling; the first decoding unit 2 decodes the information sequence including the prior information according to the LDPC check sequence received again by the receiving unit 1, where the bits of the prior information included in the information sequence are more than or equal to the bits of the prior information included in the previous decoded information sequence.

The receiver may further include a second sending unit 6, which is configured to send a second signaling to the transmitter when decoding of the second decoding unit 4 fails, where the second signaling indicates that the information sequence including the prior information is successfully decoded according to the LDPC check sequence but the decoding of the information sequence refilled with the successfully decoded bits fails; the receiving unit 1 is further configured to receive the information sequence and the LDPC check sequence corresponding to the information sequence from the transmitter again after the second sending unit 6 sends the second signaling; the second decoding unit 4 decodes the information sequence according to the LDPC check sequence newly received by the receiving unit 1. Or, the receiving unit 1 is further configured to receive the information sequence including the prior information and the corresponding LDPC check sequence from the transmitter again after the second sending unit 6 sends the second signaling, where the part except the prior information in the information sequence corresponding to the unsuccessfully decoded bits; and the second encoding unit 4 decodes the newly received information sequence according to the new LDPC check sequence and obtains the unsuccessfully decoded bits in the information sequence.

In conclusion, in the embodiments of the present invention, when retransmission is necessary, prior information recognizable to both the transmitter and the receiver is used to replace partial bits in the information sequence to be retransmitted, the information sequence obtained after the replacement is encoded with LDPC codes and an LDPC check sequence is obtained, the LDPC check sequence is sent to the receiver. After receiving the LDPC check sequence, the receiver decodes the information sequence including the prior information with the LDPC check sequence. Because unknown bits corresponding to the check sequence are fewer, the check performance is better and the probability of correct decoding by the receiver is increased. If the decoding is successful, after removing the prior information from the successfully decoded information sequence, the receiver refills the decoded information sequence without the prior information in a previous received information sequence, and decodes the refilled information sequence again with the LDPC check sequence corresponding to the previous received information sequence and obtains a complete information sequence. Because unknown bits to be checked with the LDPC check sequence are fewer, the check performance is better and the probability of correct decoding by the receiver is increased so that the system throughput is increased.

Because the substitution of prior information happens before encoding, the equivalent code rate with retransmission is reduced without changing the encoding/decoding matrix. Moreover, the encoding/decoding matrix used may be an optimal coding/decoding matrix so as to further improve the system throughput.

If the receiver fails to decode the information sequence including the prior information according to the LDPC check sequence, the transmitter may retransmit the LDPC check sequence directly; or the transmitter may substitute the prior information for more bits in the information sequence and encode the obtained information sequence with LDPC codes and obtains an LDPC check sequence of better check performance and send the new LDPC check sequence to the receiver for decoding. The processing is flexible.

If the receiver decodes the information sequence including the prior information successfully according to the LDPC check sequence but fails to decode the previous received information sequence refilled with the successfully decoded bits, the transmitter may retransmit the information sequence to be retransmitted and the corresponding LDPC check sequence to the receiver; or, the transmitter may send only the unsuccessfully decoded bits and the corresponding LDPC check sequence. The processing is flexible.

Although the exemplary embodiments of the invention have been described through exemplary embodiments, the invention is not limited to such embodiments. It is apparent that those skilled in the art can make various modifications and variations to the invention without departing from the spirit and scope of the present invention. The invention is intended to cover the modifications and variations provided that they fall in the scope of protection defined by the following claims or their equivalents.

What is claimed is:

1. A retransmission method based on low density parity check (LDPC) codes, comprising:
   generating, by a transmitter, an information sequence by substituting prior information for partial bits in an information sequence to be retransmitted, the prior information being recognizable to both the transmitter and a receiver;
   generating, by the transmitter, an LDPC check sequence by encoding the generated information sequence with LDPC codes; and
   transmitting, by the transmitter, the LDPC check sequence to the receiver.

2. The method of the claim 1, further comprising:
   receiving, by the transmitter, a first signaling indicating the receiver fails to decode an information sequence including the prior information according to the LDPC check sequence; and
   retransmitting, by the transmitter, the LDPC check sequence.

3. The method of the claim 1, further comprising:
   receiving, by the transmitter, a first signaling indicating the receiver fails to decode an information sequence including the prior information according to the LDPC check sequence;
   generating, by the transmitter, a new information sequence by substituting the prior information for partial bits in the information sequence to be retransmitted, the number of the bits of the prior information in the new generated information sequence is greater than the number of the bits of the prior information in the generated information sequence;
   generating, by the transmitter, a new LDPC check sequence by encoding the new generated information sequence with the LDPC codes; and
   transmitting, by the transmitter, the new LDPC check sequence to the receiver.

4. The method of the claim 1, further comprising:
   receiving, by the transmitter, a second signaling, the second signaling indicating that the receiver successfully decodes the information sequence including the prior information according to the LDPC check sequence, but fails to decode the information sequence refilled with the successfully decoded bits; and
   transmitting, by the transmitter, the information sequence to be retransmitted and an LDPC check sequence obtained by encoding the information sequence to be retransmitted with LDPC codes.

5. The method of the claim 1, further comprising:
   receiving, by the transmitter, a second signaling, the second signaling indicating that the receiver successfully decodes the information sequence including the prior information according to the LDPC check sequence, but fails to decode the information sequence refilled with the successfully decoded bits;
   generating, by the transmitter, a new information sequence by substituting the prior information for the bits, which are successfully decoded by the receiver in the information sequence;
   generating, by the transmitter, a new LDPC check sequence by encoding the new generated information sequence with the LDPC codes; and
   transmitting, by the transmitter, the new LDPC check sequence and the new generated information sequence to the receiver.

6. The method of claim 1, the method further comprising:
   transmitting, by the transmitter, the information sequence including the prior information to the receiver when transmitting the LDPC check sequence to the receiver, the information sequence corresponding to the LDPC check sequence.

7. A retransmission receiving method based on LDPC codes, comprising:
   receiving, by a receiver, an LDPC check sequence from a transmitter;
   decoding, by the receiver, an information sequence including prior information according to the LDPC check sequence, the prior information being recognizable to both the transmitter and the receiver;
   if the decoding is successful, obtaining, by the receiver, a complete information sequence by decoding a refilled information sequence with an LDPC check sequence corresponding to a previous received information sequence, the refilled information sequence is generated by refilling the decoded information sequence without the prior information in the previous received information sequence.

8. The method of claim 7, the refilled information sequence is generated by refilling a likelihood ratio information corresponding to the decoded information sequence without the prior information in the previous received information sequence, the likelihood ratio information is generated by mapping the decoded information sequence without the prior information.

9. The method of claim 7, further comprising:
   sending by the receiver, a first signaling if decoding the information sequence including the prior information fails, the first signaling indicating the receiver fails to decode the information sequence including the prior information according to the LDPC check sequence;
   re-receiving, by the receiver, the LDPC check sequence from the transmitter; and
   decoding, by the receiver, the information sequence including the prior information according to the re-received LDPC check sequence, the number of bits of the prior information in the information sequence is greater than or equal to the number of bits of the prior information in the last decoding information sequence.

10. The method of claim 7, further comprising:
    sending, by the receiver, a second signaling to the transmitter if decoding the refilled information sequence fails, the second signaling indicating that the receiver successfully decodes the information sequence including the prior information according to the LDPC check sequence succeeds, but fails to decode the information sequence with the successfully decoded bits;

re-receiving, by the receiver, the previous received information sequence and the LDPC check sequence corresponding to the previous received information sequence from the transmitter, and decoding, by the receiver, the re-received information sequence according to the re-received LDPC check sequence.

11. The method of claim 7, further comprising:

sending, by the receiver, a second signaling to the transmitter if decoding the refilled information sequence fails, the second signaling indicating that the receiver successfully decodes the information sequence including the prior information according to the LDPC check sequence succeeds, but fails to decode the information sequence with the successfully decoded bits;

re-receiving, by the receiver, a new information sequence including the prior information and a new LDPC check sequence corresponding to the new information sequence, the part except the prior information in the new information sequence corresponding to the unsuccessfully decoded bits; and obtaining, by the receiver, the unsuccessfully decoded bits by decoding the new information sequence according to the new LDPC check sequence.

12. A transmitter, comprising: a substituting unit, configured to substitute prior information for partial bits of an information sequence to be retransmitted, the prior information being recognizable to both the transmitter and a receiver; an encoding unit, configured to encode the information sequence obtained by the substituting unit with LDPC codes and obtain an LDPC check sequence; and a sending unit, configured to send the LDPC check sequence outputted from the encoding unit to the receiver.

13. The transmitter of the claim 12, further comprising:

a first judging unit, configured to determine whether a first signaling from the receiver is received, the first signaling indicating the receiver fails to decode an information sequence including the prior information according to the LDPC check sequence, and instruct the sending unit to retransmit the LDPC check sequence if the first signaling is received.

14. The transmitter of the claim 12, further comprising:

a first judging unit, configured to determine whether a first signaling from the receiver is received, the first signaling indicating the receiver fails to decode an information sequence including the prior information according to the LDPC check sequence, and instruct the substituting unit to substitute the prior information for partial bits in the information sequence to be retransmitted if the first signaling is received, the number of the current replaced bits is greater than the number of the last replaced bits;

the encoding unit, further configured to encode the information sequence current obtained by the substituting unit with the LDPC codes, and obtain a new LDPC check sequence; and the sending unit, further configured to send the new LDPC check sequence outputted from the encoding unit to the receiver.

15. The transmitter of the claim 12, further comprising:

a second judging unit, configured to judge whether a second signaling from the receiver is received, the second signaling indicating the receiver successfully decodes an information sequence including the prior information according to the LDPC check sequence, but fails to decode the information sequence refilled with successfully decoded bits, and instruct the sending unit to send the information sequence to be retransmitted and an LDPC check sequence obtained by encoding the information sequence to be retransmitted with LDPC codes to the receiver if the second signaling is received.

16. The transmitter of the claim 12, further comprising:

a second judging unit, configured to judge whether a second signaling from the receiver is received, the second signaling indicating the receiver successfully decodes an information sequence including the prior information according to the LDPC check sequence, but fails to decode the information sequence refilled with successfully decoded bits, and instruct the substituting unit to substitute the prior information for the successfully decoded bits in the information sequence if the second signaling is received;

the encoding unit further configured to encode the information sequence current obtained by the substituting unit with the LDPC codes, and obtain an new LDPC check sequence; and the sending unit further configured to send the new LDPC check sequence outputted from the encoding unit and the information sequence obtained by the substituting unit to the receiver.

17. A receiver, comprising:

a receiving unit, configured to receive an LDPC check sequence from a transmitter;

a first decoding unit, configured to decode an information sequence including prior information according to the LDPC check sequence, the prior information being recognizable both to the receiver and the transmitter;

a refilling unit, configured to remove the prior information from decoded information sequence if the first decoding unit decodes successfully, and refill the decoded information without the prior information in a previous received information sequence;

a second decoding unit, configured to decode the refilled information sequence with an LDPC check sequence corresponding to the previous received information sequence, and obtain a complete information sequence.

18. The receiver of the claim 17, further comprising:

a first sending unit, configured to send a first signaling to the transmitter if the first decoding fails to decode, the first signaling indicating that the decoding of the information sequence including the prior information according to the LDPC check sequence fails; and the receiving unit further configured to re-receive the LDPC check sequence from the transmitter after the first sending unit sends the first signaling;

the first decoding unit further configured to decode the information sequence including the prior information according to the LDPC check sequence re-received by the receiving unit, and the number of bits in the information sequence is greater than or equal to the number of bits in the last decoding information sequence.

19. The receiver of the claim 17, further comprising:

a second sending unit, configured to send a second signaling to the transmitter if the second decoding unit fails to decode, the second signaling indicating that the first decoding unit successfully decodes the information sequence including the prior information according to the LDPC check sequence succeeds, but the second decoding unit fails to decode the information sequence refilled with the successfully bits fails;

the receiving unit further configured to re-receive the previous received information sequence and the LDPC check sequence corresponding to the previous received information sequence after the second sending unit sends the second signaling; and the second decoding unit further configured to decode the re-received information sequence according to the re-received LDPC check sequence.

20. The receiver of the claim 17, further comprising:

a second sending unit, configured to send a second signaling to the transmitter if the second decoding unit fails to decode, the second signaling indicating that the first decoding unit successfully decodes the information sequence including the prior information according to the LDPC check sequence succeeds, but the second decoding unit fails to decode the information sequence refilled with the successfully bits fails;

the receiving unit further configured to re-receive a new information sequence including the prior information and a new LDPC check sequence corresponding to the new information sequence, the part except the prior information in the new information sequence corresponding to the unsuccessfully decoded bits after the second sending unit send the second signaling; and the second decoding unit further configured to decode the re-received new information sequence according to the re-received LDPC check sequence, and obtain the unsuccessfully decoded bits.

* * * * *